US012707657B2

(12) United States Patent
Chen et al.

(10) Patent No.: US 12,707,657 B2
(45) Date of Patent: Aug. 11, 2026

(54) THIN FILM RESISTOR

(71) Applicant: Taiwan Semiconductor Manufacturing Company, Ltd., Hsinchu (TW)

(72) Inventors: Chun-Heng Chen, Hsinchu City (TW); Chi-Yuan Shih, Hsinchu (TW); Hsin-Li Cheng, Hsinchu (TW); Shih-Fen Huang, Zhubei (TW); Tuo-Hsin Chien, Hsinchu County (TW); Yu-Chi Chang, Kaohsiung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 380 days.

(21) Appl. No.: 18/470,180

(22) Filed: Sep. 19, 2023

(65) Prior Publication Data

US 2025/0006777 A1 Jan. 2, 2025

Related U.S. Application Data

(60) Provisional application No. 63/510,673, filed on Jun. 28, 2023.

(51) Int. Cl.

| | |
|---|---|
| ***H10D 1/47*** | (2025.01) |
| ***H01C 7/00*** | (2006.01) |
| ***H01C 17/075*** | (2006.01) |
| ***H01C 17/24*** | (2006.01) |
| ***H10W 44/00*** | (2026.01) |

(52) U.S. Cl.

CPC ............ *H10D 1/474* (2025.01); *H01C 7/006* (2013.01); *H01C 17/075* (2013.01); *H01C 17/2416* (2013.01); *H10W 44/401* (2026.01)

(58) Field of Classification Search

None

See application file for complete search history.

(56) References Cited

U.S. PATENT DOCUMENTS

| | | | | |
|---|---|---|---|---|
| 4,746,896 A | | 5/1988 | Mcquaid | |
| 5,494,845 A | | 2/1996 | Sereda | |
| 9,627,467 B2 | | 4/2017 | Tseng | |
| 2005/0258513 A1* | | 11/2005 | Eshun | H01C 1/142 257/E21.006 |

(Continued)

FOREIGN PATENT DOCUMENTS

| | | |
|---|---|---|
| DE | 106493 A1 | 6/1974 |
| JP | 7245303 B2 | 3/2023 |
| KR | 20210053148 A | 5/2021 |

*Primary Examiner* — Nduka E Ojeh

(74) *Attorney, Agent, or Firm* — HAYNES AND BOONE, LLP

(57) ABSTRACT

Resistors and method of forming the same are provided. A device structure according to the present disclosure includes a substrate, a first intermetal dielectric (IMD) layer over the substrate, a resistor that includes a first resistor layer over the first IMD layer, a second resistor layer over the first resistor layer, and a third resistor layer over the second resistor layer, a second IMD layer over the first IMD layer and the resistor, a first contact via extending through the second IMD layer and the third resistor layer and terminating in the first resistor layer, and a second contact via extending through the second IMD layer and the third resistor layer and terminating in the first resistor layer.

20 Claims, 18 Drawing Sheets

(56) References Cited

U.S. PATENT DOCUMENTS

| | | | | |
|---|---|---|---|---|
| 2006/0199315 | A1 | 9/2006 | Jaiswal | |
| 2011/0177668 | A1 | 7/2011 | Yeh | |
| 2012/0049997 | A1 | 3/2012 | Lim | |
| 2015/0348908 | A1* | 12/2015 | Nagakura | H10D 86/85<br>257/536 |
| 2019/0206980 | A1* | 7/2019 | Jan | H10D 1/474 |
| 2021/0343642 | A1 | 11/2021 | Kande | |
| 2022/0045049 | A1* | 2/2022 | Hung | H10D 84/206 |
| 2023/0069542 | A1 | 3/2023 | Lo | |
| 2024/0421074 | A1* | 12/2024 | Wong | H10W 20/498 |

* cited by examiner 204
202
210
208
206
400
300
212
400
200

X
Z
Y

THIN FILM RESISTOR

PRIORITY DATA

The present application claims the benefit of U.S. Provisional Application No. 63/510,673, filed Jun. 28, 2023, the entirety of which is herein incorporated by reference.

BACKGROUND

Modern integrated circuit (IC) chips use passive devices and active devices to achieve varying functionalities. Active devices include transistors (e.g., metal-oxide-semiconductor field-effect transistor (MOSFETs)), while passive devices include inductors, capacitors, and resistors. Resistors are widely used in many applications such as digital-to-analog converter (DAC), resistor-capacitor (RC) circuits, power drivers, power amplifiers, signal filters, and radio frequency (RF) applications. Because passive devices usually take much more space than active devices, they are usually fabricated in the middle-end-of-line (MEOL) or back-end-of-line (BEOL) processes. Thin film resistors (TFRs) are an important type of resistors. The semiconductor industry is constantly looking for ways to manufacture high performance thin film transistors economically.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

Figure 1:
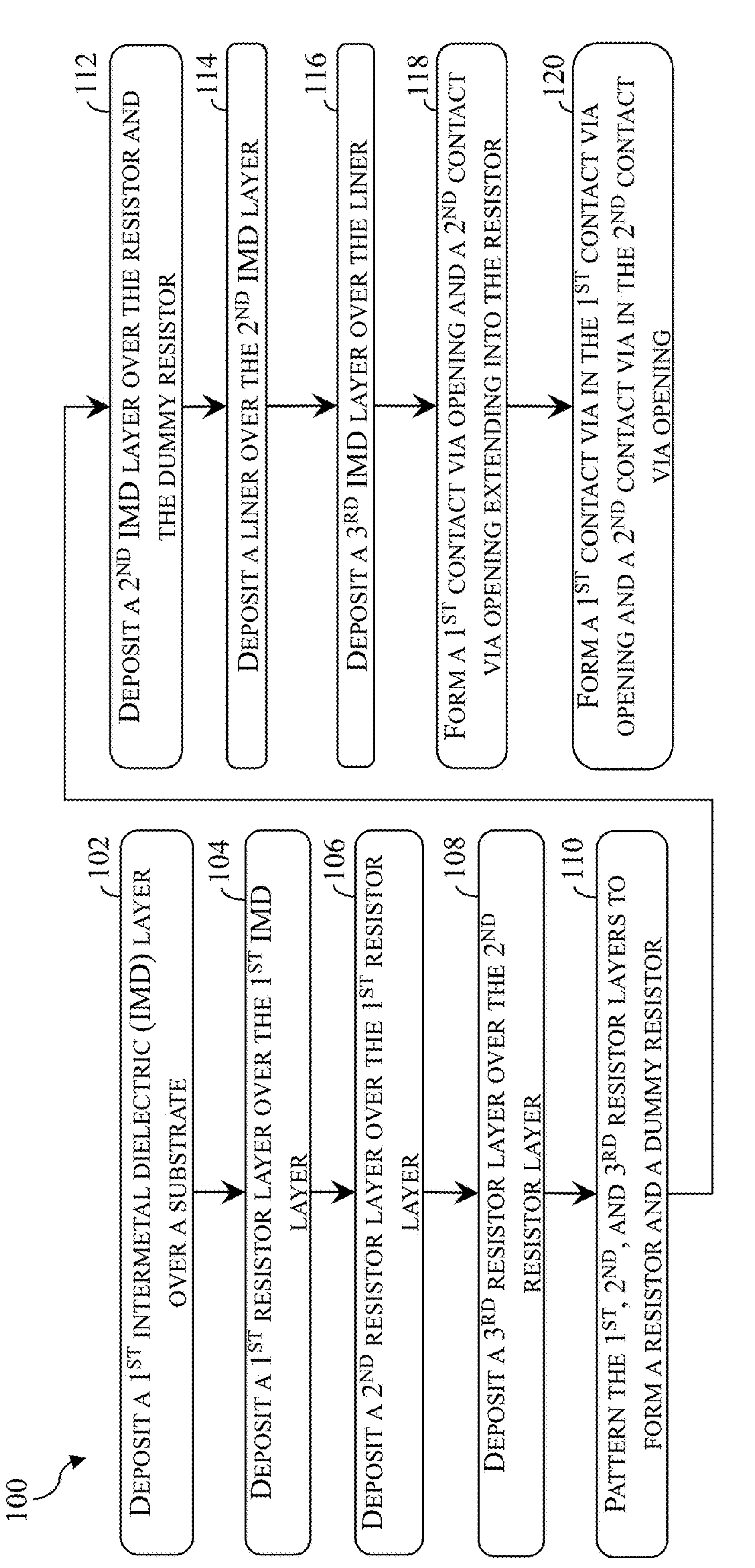
FIG. 1 is a flowchart illustrating a method of fabricating a resistor according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with “about,” “approximate,” and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of “about 5 nm” can encompass a dimension range from 4.25 nm to 5.75 nm where manufacturing tolerances associated with depositing the material layer are known to be +/−15% by one of ordinary skill in the art.

Resistors are widely used in many applications such as digital-to-analog converter (DAC), resistor-capacitor (RC) circuits, power drivers, power amplifiers, signal filters, and radio frequency (RF) applications. Because passive devices usually take much more space than active devices, they are usually fabricated in the middle-end-of-line (MEOL) or back-end-of-line (BEOL) processes. Fabricating resistors in the MEOL or BEOL structures also reduces routing. Thin film resistors have gained popularity because they have lower noise, lower parasitic inductance, lower capacitance, and lower temperature coefficient of resistance (TCR). TCR represents a relative change of resistance per degree of temperature change. In circuit design, it is desirable to have a resistor with zero TCR or the performance of the circuit may change with temperature change. Thin films made with different materials may have different resistance-change factors ($\alpha$). Some materials have a positive resistance-change factor and some have a negative resistance-change factor. In some existing technologies, fabrication of a thin film resistor involves multiple photolithography steps. For example, at least one photolithography step is performed to pattern the thin film resistor and at least another photolithography step is performed to pattern the contacts on the thin film resistor. In semiconductor fabrication, each photolithography step requires an additional mask, which means additional cost and additional process time.

The present disclosure provides a laminate thin film resistor and a cost effective method to form the same. The laminate thin film resistor according to the present disclosure includes multiple resistor layers deposited one over another. Each of the multiple layers may be formed of different materials selected from a chromium-containing material, titanium nitride, tantalum nitride, titanium tungsten, or tantalum tungsten. The compositions of the resistor layers are selected such that the overall effective temperature coefficient of resistance of the laminate thin film resistor is substantially zero. The method according to the present disclosure forms not only the laminate thin film resistor but also at least dummy resistor adjacent or around the laminate thin film resistor to reduce loading effect. Instead of performing a separate photolithography step to form contacts on the laminate thin film resistor, the method of the present disclosure includes forming contact vias that penetrates top resistor layers of the laminate thin film resistor and terminates in the bottommost resistor layer of the laminate thin film resistor.

Figure 13:
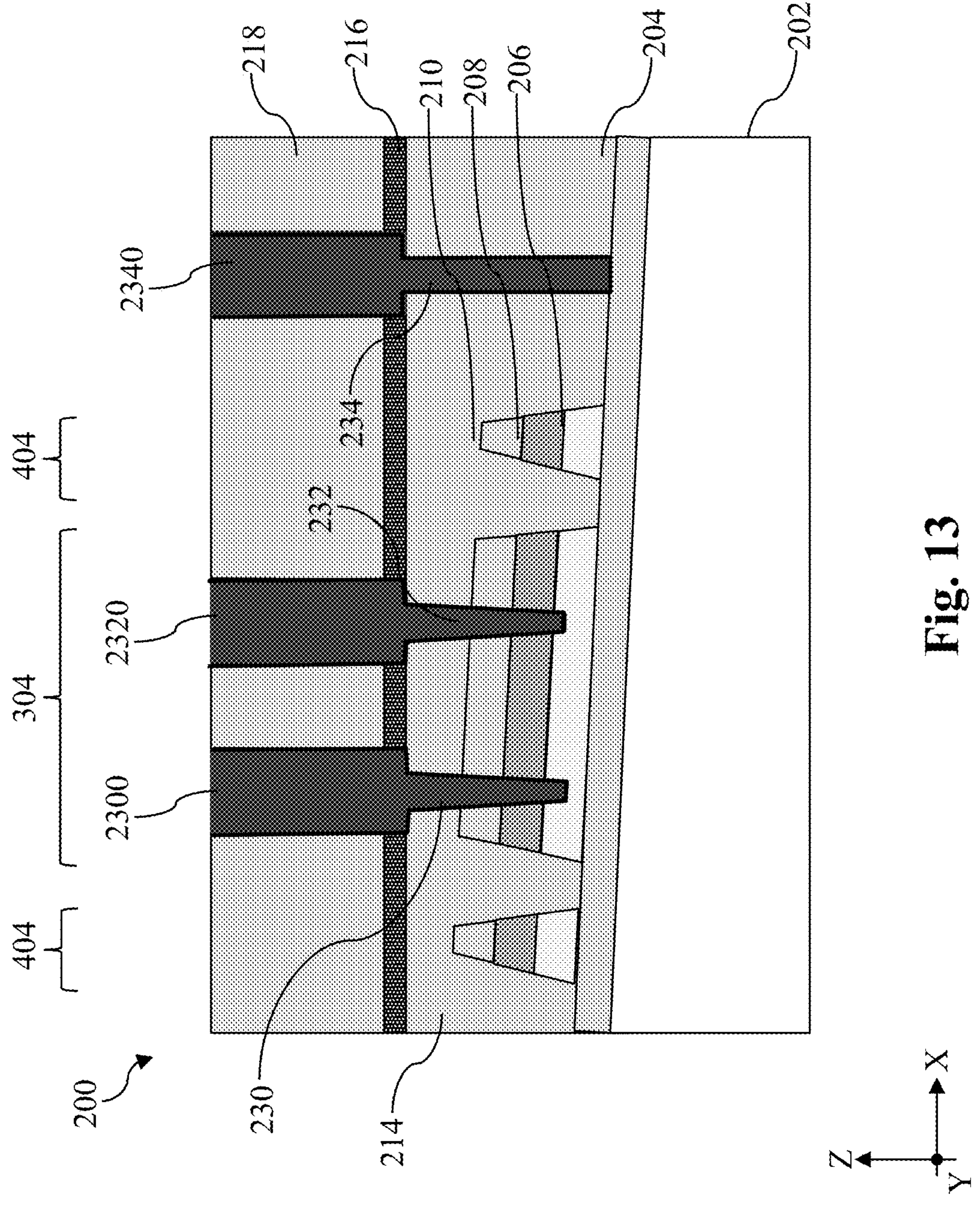
Figure 14:
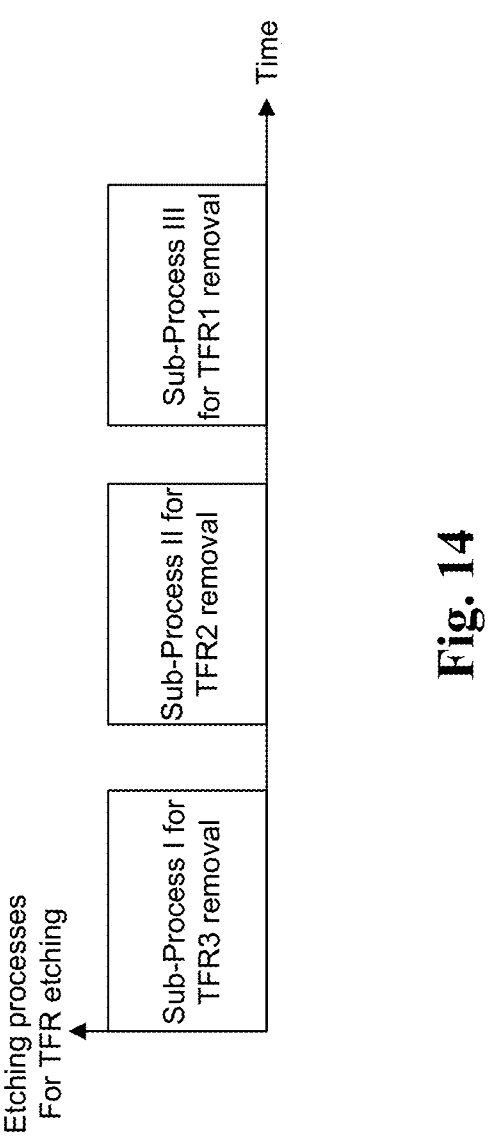
FIG. 14 illustrates etching processes and etching rates used to form tapered sidewalls of the thin film transistor of the present disclosure.

The various aspects of the present disclosure will now be described in more detail with reference to the figures. In that regard, FIG. 1 is a flowchart illustrating method 100 of forming a laminate thin film resistor according to embodiments of the present disclosure. Method 100 is merely an example and is not intended to limit the present disclosure to what is explicitly illustrated in method 100. Additional steps may be provided before, during and after the method 100, and some steps described can be replaced, eliminated, or moved around for additional embodiments of the method. Not all steps are described herein in detail for reasons of simplicity. Method 100 is described below in conjunction with FIGS. 2-13, which are fragmentary cross-sectional views a workpiece 200 at different stages of fabrication according to embodiments of method 100. FIG. 14 illustrates an example etching process to pattern the laminate thin film resistor such that the laminate thin film resistor has sidewalls that taper upward. FIGS. 15-18 illustrates different configurations of the laminate thin film resistor in a top view. Because the workpiece 200 will be fabricated into a semiconductor device at the conclusion of the fabrication processes, the workpiece 200 may also be referred to as a semiconductor device 200 as the context requires. Additionally, throughout the present application, like reference numerals denote like features, unless otherwise excepted.

Figure 2:
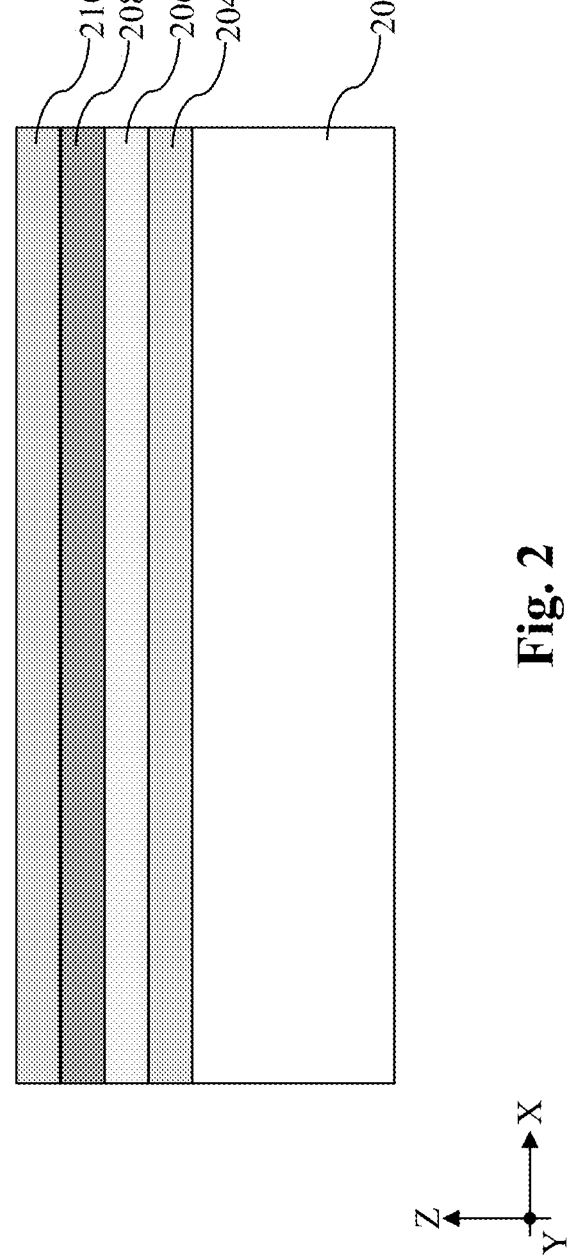
FIGS. 2-13 illustrate diagrammatic fragmentary cross-sectional views of a workpiece undergoing various stages of fabrication according to the method of FIG. 1, according to various aspects of the present disclosure.

Referring to FIGS. 1 and 2, method 100 includes a block 102 where a first intermetal dielectric (IMD) layer 204 is deposited on a substrate 202. In some embodiments, the first IMD layer 204 includes silicon oxide, undoped silica glass (USG), phosphor doped silicate glass (PSG), fluorine doped silicate glass (FSG), a boron doped silicate glass (BSG) layer, or a boron phosphorous-doped silicate glass (BPSG). The substrate 202 may be a silicon (Si) substrate. In some other embodiments, the substrate 202 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 202 may also include an insulating layer, such as a silicon oxide layer, to have a silicon-on-insulator (SOI) structure.

Referring to FIGS. 1 and 2, method 100 includes a block 104 where a first resistor layer 206 (or TFR1) is deposited over the first IMD layer 204. The first resistor layer 206 may have a sheet resistance between about 300 ohms/square and about 2000 ohms/square. The first resistor layer 206 may include a chromium-containing material, titanium nitride (TiN), titanium tungsten (TiW), tantalum nitride (TaN), or tantalum tungsten (TaW). In some instances, the chromium-containing material includes silicon chromium (SiCr), nickel chromium (NiCr, or nichrome), nickel chromium silicon (NiCrSi), chromium silicate (Cr—SiO), or silicon chromium nitride (SiCrN). The first resistor layer 206 may be deposited using PVD (e.g., sputtering or pulsed laser deposition (PLD)), CVD, atomic layer deposition (ALD), metalorganic CVD (MOCVD), other suitable techniques, or combinations thereof. As shown in FIG. 2, the first resistor layer 206 (TFR1) is the bottommost resistor layer, which will be disposed below a second resistor layer 208 (TFR2) and a third resistor layer 210 (TFR3). As will be described further below, the laminate resistor (resistor 300, to be described below) that includes the first resistor layer 206, the second resistor layer 208 and the third resistor layer 210 is to be accessed by contact vias that extend into the laminate resistor from above. In order to make sure that electrical current flow through all three resistor layers and does not short circuit through the topmost third resistor layer 210, a sheet resistance of the third resistor layer 210 is greater than a sheet resistance of the second resistor layer 208 and a sheet resistance of the first resistor layer 206 is smaller than the sheet resistance of the second resistor layer 208.

Different mechanisms may be applied to change or tune sheet resistance of the first resistor layer 206. For a first example, a thickness of the first resistor layer 206 may be increased to reduce its sheet resistance or decreased to increase its sheet resistance. For a second example, when the first resistor layer 206 is formed of a metal nitride, such as titanium nitride (TiN) or tantalum nitride (TaN), sheet resistance of the first resistor layer 206 may decrease with increased crystallinity and crystalline grain size. For a third example, when the first resistor layer 206 is formed of a metal alloy, such as titanium tungsten (TiW), nickel chromium (NiCr, or nichrome), or tantalum tungsten (TaW), sheet resistance of the first resistor layer 206 may increase as the content (or atomic percentage) of the less conductive metal component increases. For a fourth example, when the first resistor layer 206 includes an alloy or a compound that has a semiconductor component and a metal component, such as silicon chromium (SiCr), nickel chromium silicon (NiCrSi), chromium silicate (Cr—SiO), or silicon chromium nitride (SiCrN), sheet resistance of the first resistor layer 206 may increase when the content (or atomic percentage) of silicon increases.

The first resistor layer 206 may have a positive temperature coefficient of resistance (TCR) or a negative TCR. Different mechanisms may be applied to change TCR of the first resistor layer 206. For a first example, when the first resistor layer 206 is formed of a metal nitride, such as titanium nitride (TiN) or tantalum nitride (TaN), the first resistor layer 206 may have a negative TCR when the first resistor layer 206 has a small grain size and a high defect density or a positive TCR when the first resistor layer 206 has a large grain size and a low defect density. For a second example, when the first resistor layer 206 includes an alloy or a compound that has a semiconductor component and a metal component, such as silicon chromium (SiCr), nickel chromium silicon (NiCrSi), chromium silicate (Cr—SiO), or silicon chromium nitride (SiCrN), TCR of the first resistor layer 206 may be negative when the first resistor layer 206 includes more silicon than of the metal component. Contrarily, TCR of the first resistor layer 206 may be positive when the first resistor layer 206 includes more of the metal component than of silicon. This is so because semiconductors and metals conduct current differently. Semiconductors, such as silicon, conduct current when valence electrons gain enough energy to jump to the conduction band. Increase of thermal energy in the form of increasing temperature provides more energy to the valence electrons. Conductors, such as metals or metal alloys, conduct current through free electrons. When temperature increases, free electrons may lose energy due to collision with other electrons. By adjusting the TCRs of the first resistor layer 206 and the other resistor layers to balance out the resistor layer(s) with positive TCR and the resistor layer(s) with negative TCR, the resulting laminate resistor may have an effective TCR that is substantially zero, such as between about −50 ppm/° C. and 50 ppm/° C.

When the first resistor layer 206 includes a chromium-containing material, it may have a thickness between about 50 Å and about 200 Å. When the first resistor layer 206 includes titanium nitride (TiN), titanium tungsten (TiW), tantalum nitride (TaN), or tantalum tungsten (TaW), it may have a thickness between about 50 Å and about 1000 Å. In one example, the first resistor layer 206 includes a chromium-containing material, such as silicon chromium (SiCr), nickel chromium (NiCr, or nichrome), nickel chromium silicon (NiCrSi), chromium silicate (Cr—SiO), or silicon chromium nitride (SiCrN). In an alternative example, the first resistor layer 206 includes tantalum nitride (TaN), titanium nitride (TiN), titanium tungsten (TiW), or tantalum tungsten (TaW).

Referring to FIGS. 1 and 2, method 100 includes a block 106 where a second resistor layer 208 (or TFR2) is deposited over the first resistor layer 206. The second resistor layer 208 may have a sheet resistance between about 300 ohms/square and about 2000 ohms/square. The second resistor layer 208 may include a chromium-containing material. In some instances, the chromium-containing material includes silicon chromium (SiCr), nickel chromium (NiCr, or nichrome), nickel chromium silicon (NiCrSi), chromium silicate (Cr—SiO), or silicon chromium nitride (SiCrN). The second resistor layer 208 may be deposited using PVD (e.g., sputtering or pulsed laser deposition (PLD)), CVD, atomic layer deposition (ALD), metalorganic CVD (MOCVD), other suitable techniques, or combinations thereof. When the second resistor layer 208 includes a chromium-containing material, it may have a thickness between about 50 Å and about 200 Å.

As shown in FIG. 2, the second resistor layer 208 (TFR2) is sandwiched between the first resistor layer 206 and a third resistor layer 210 (TFR3). As will be described further below, the laminate resistor (resistor 300, to be described below) that includes the first resistor layer 206, the second resistor layer 208 and the third resistor layer 210 is to be accessed by contact vias that extend into the laminate resistor from above. In order to make sure that electrical current flow through all three resistor layers and does not short circuit through the topmost third resistor layer 210, a sheet resistance of the third resistor layer 210 is greater than a sheet resistance of the second resistor layer 208 and a sheet resistance of the first resistor layer 206 is smaller than the sheet resistance of the second resistor layer 208. That is, the sheet resistance of the second resistor layer 208 may fall between that of the first resistor layer 206 and that of the third resistor layer 210.

Different mechanisms may be applied to change or tune sheet resistance of the second resistor layer 208. For a first example, a thickness of the second resistor layer 208 may be increased to reduce its sheet resistance or decreased to increase its sheet resistance. For a second example, when the second resistor layer 208 is formed of a metal alloy, such as nickel chromium (NiCr, or nichrome), sheet resistance of the second resistor layer 208 may increase as the content (or atomic percentage) of chromium increases. For a third example, when the second resistor layer 208 includes an alloy or a compound that has a semiconductor component and a metal component, such as silicon chromium (SiCr), nickel chromium silicon (NiCrSi), chromium silicate (Cr—SiO), or silicon chromium nitride (SiCrN), sheet resistance of the second resistor layer 208 may increase when the content (or atomic percentage) of silicon increases.

The second resistor layer 208 may have a positive temperature coefficient of resistance (TCR) or a negative TCR. Different mechanisms may be applied to change TCR of the second resistor layer 208. For example, when the second resistor layer 208 includes an alloy or a compound that has a semiconductor component and a metal component, such as silicon chromium (SiCr), nickel chromium silicon (NiCrSi), chromium silicate (Cr—SiO), or silicon chromium nitride (SiCrN), TCR of the second resistor layer 208 may be negative when the second resistor layer 208 includes more of silicon than of the metal component. Contrarily, TCR of the second resistor layer 208 may be positive when the second resistor layer 208 includes more of the metal component than of silicon. By adjusting the TCRs of the second resistor layer 208 and the other resistor layers to balance out the resistor layer(s) with positive TCR and the resistor layer(s) with negative TCR, the resulting laminate resistor may have an effective TCR that is substantially zero.

Referring to FIGS. 1 and 2, method 100 includes a block 108 where a third resistor layer 210 (or TFR3) is deposited over the second resistor layer 208. The third resistor layer 210 may have a sheet resistance between about 300 ohms/square and about 2000 ohms/square. Disposed over the other two resistor layers, the third resistor layer 210 assumes more of a protective layer role. Because metal alloys or metal nitrides are generally more chemically stable than semiconductor-metal alloys, the third resistor layer 210 may include titanium nitride (TiN), titanium tungsten (TiW), tantalum nitride (TaN), or tantalum tungsten (TaW), rather than the chromium-containing material (e.g., silicon chromium (SiCr), nickel chromium (NiCr), nickel chromium silicon (NiCrSi), chromium silicate (Cr—SiO), or silicon chromium nitride (SiCrN)) that may be used for the first resistor layer 206 or the second resistor layer 208. The third resistor layer 210 may be deposited using PVD (e.g., sputtering or pulsed laser deposition (PLD)), CVD, atomic layer deposition (ALD), metalorganic CVD (MOCVD), other suitable techniques, or combinations thereof. In one embodiment, the third resistor layer 210 includes a thickness between about 50 Å and about 1000 Å.

As shown in FIG. 2, the third resistor layer 210 (TFR3) is disposed over the second resistor layer 208 (TFR2). As will be described further below, the laminate resistor (resistor 300, to be described below) that includes the first resistor layer 206, the second resistor layer 208 and the third resistor layer 210 is to be accessed by contact vias that extend into the laminate resistor from above. In order to make sure that electrical current flow through all three resistor layers and does not short circuit through the topmost third resistor layer 210, a sheet resistance of the third resistor layer 210 is greater than a sheet resistance of the second resistor layer 208 and a sheet resistance of the first resistor layer 206 is smaller than the sheet resistance of the second resistor layer 208.

Like the first resistor layer 206, different mechanisms may be applied to change or tune sheet resistance of the third resistor layer 210. For a first example, a thickness of the third resistor layer 210 may be increased to reduce its sheet resistance or decrease to increase its sheet resistance. For a second example, when the third resistor layer 210 is formed of a metal nitride, such as titanium nitride (TiN) or tantalum nitride (TaN), sheet resistance of the third resistor layer 210 may decrease with increased crystallinity and crystalline grain size. For a third example, when the third resistor layer 210 is formed of a metal alloy, such as titanium tungsten (TiW) or tantalum tungsten (TaW), sheet resistance of the third resistor layer 210 may increase as the content (or atomic percentage) of the less conductive metal component increases.

The third resistor layer 210 may have a positive temperature coefficient of resistance (TCR) or a negative TCR. Different mechanisms may be applied to change TCR of the third resistor layer 210. For example, when the third resistor layer 210 is formed of a metal nitride, such as titanium nitride (TiN) or tantalum nitride (TaN), the third resistor layer 210 may have a negative TCR when the third resistor layer 210 has a small grain size and a high defect density or a positive TCR when the third resistor layer 210 has a large grain size and a low defect density. By adjusting the TCRs of the third resistor layer 210 and the other resistor layers to balance out the resistor layer(s) with positive TCR and the resistor layer(s) with negative TCR, the resulting laminate resistor may have an effective TCR that is substantially zero, such as between about −50 ppm/° C. and 50 ppm/° C.

Figure 3:
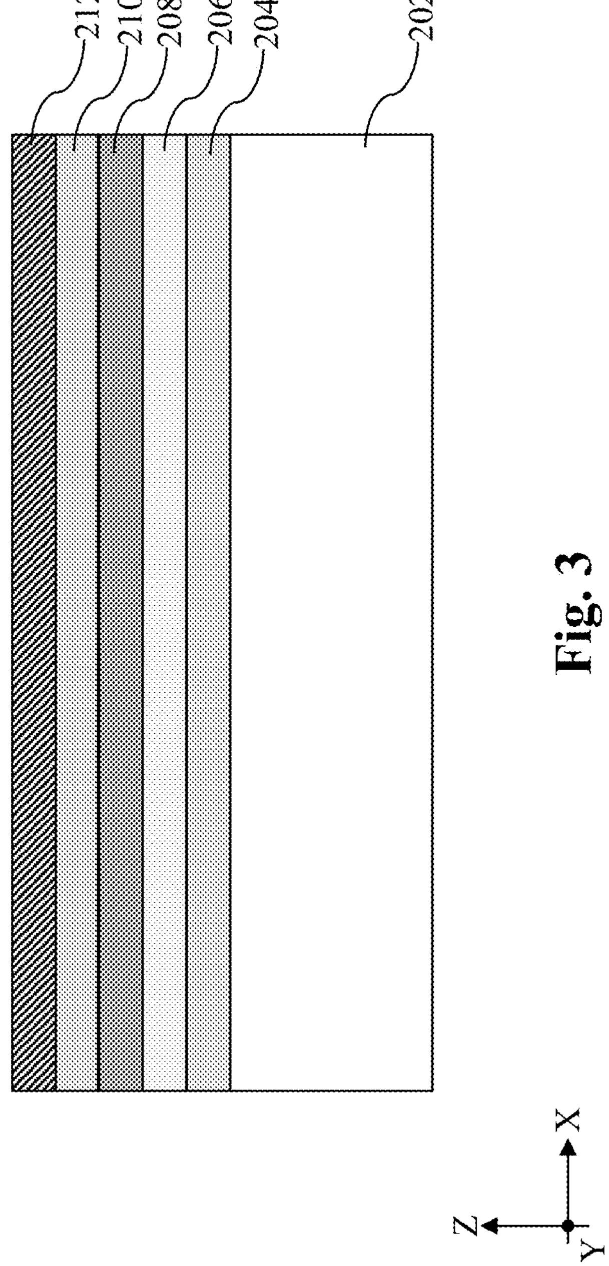
Figure 4:
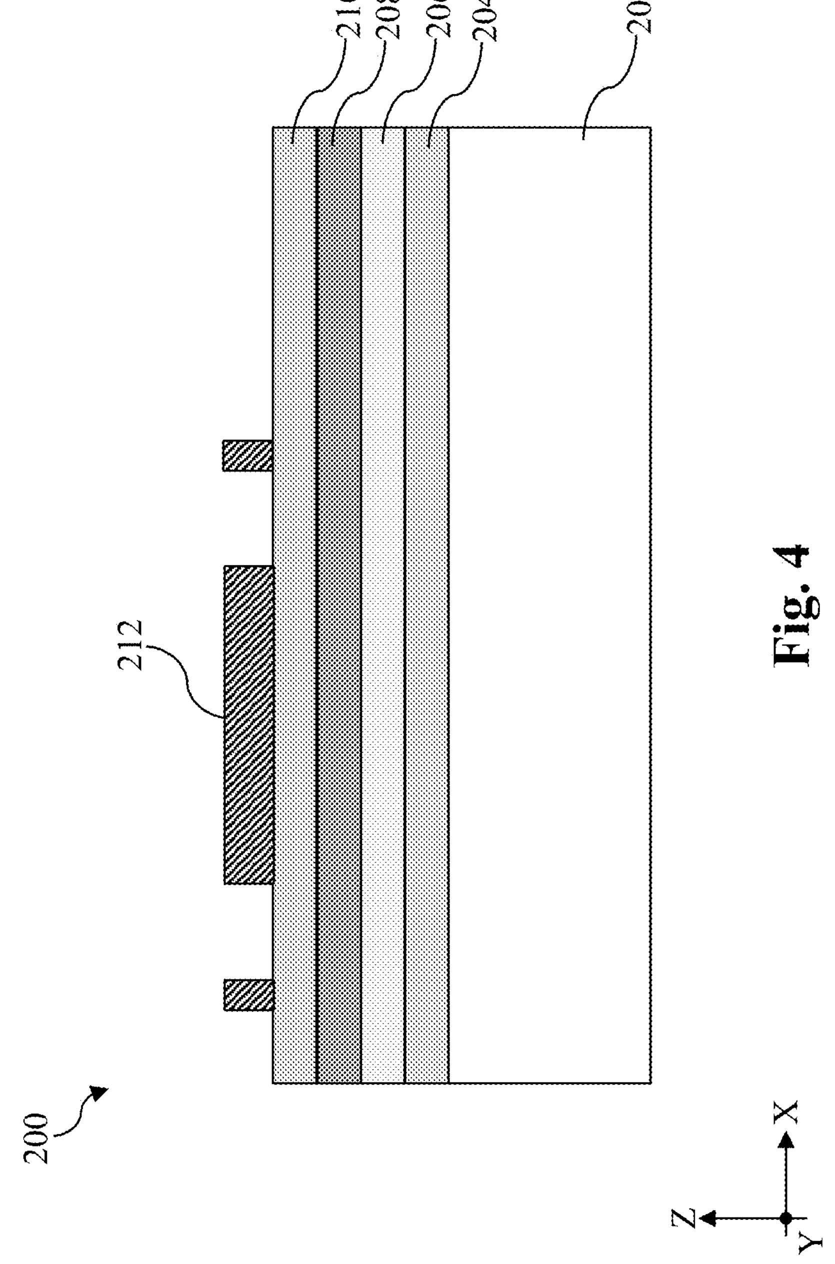
Figure 5:
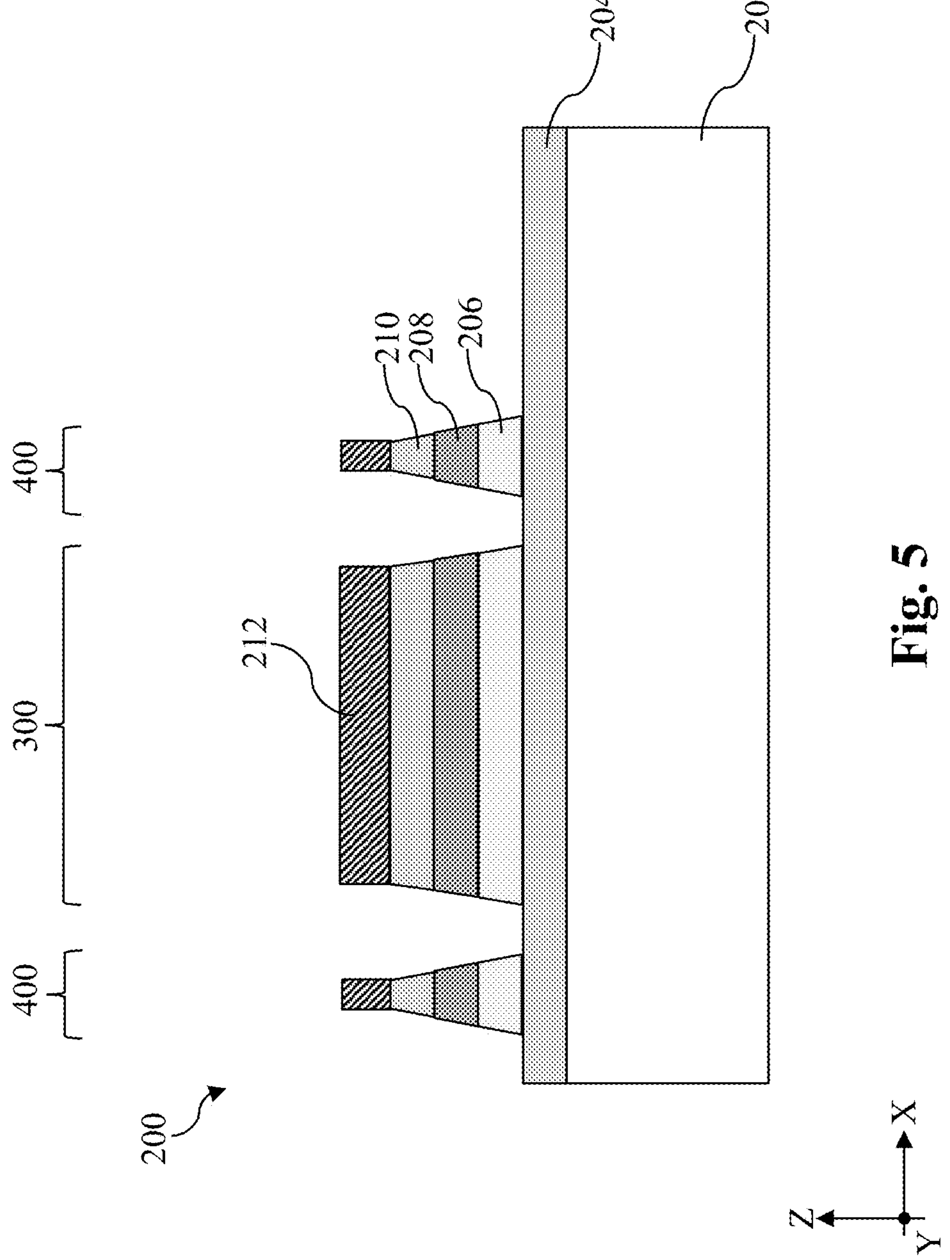
Figure 6:
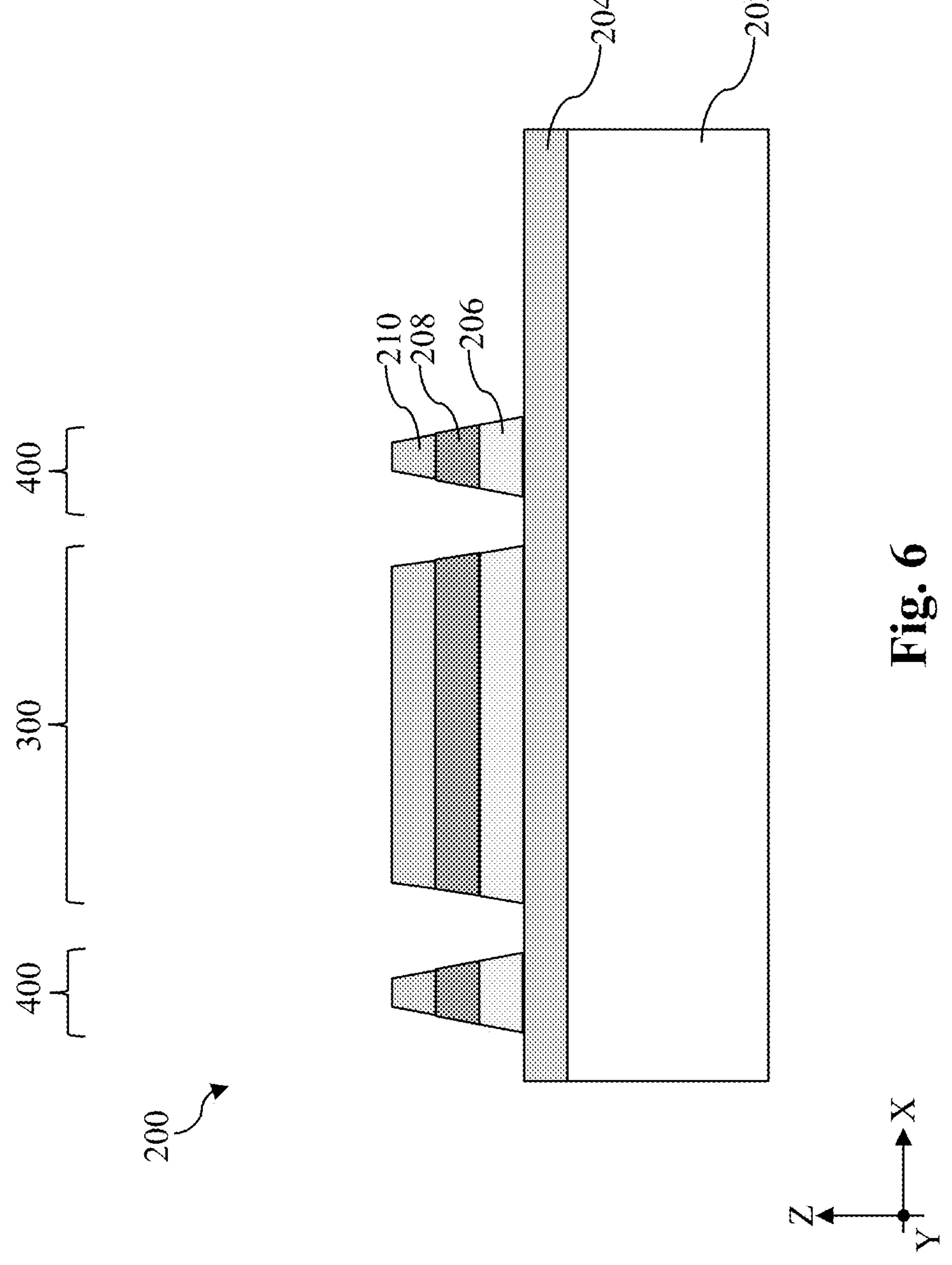

Referring to FIGS. 1, 3, 4, 5, and 6, method 100 includes a block 110 where the first resistor layer 206, the second resistor layer 208 and the third resistor layer 210 are patterned to form a resistor 300 and a dummy resistor 400. In some embodiments, operations at block 110 include deposition of a photoresist layer 212 (shown in FIG. 3), patterning of the photoresist layer 212 (shown in FIG. 4), patterning the first resistor layer 206, the second resistor layer 208 and the third resistor layer 210 to form a resistor 300 and a dummy resistor 400 (shown in FIG. 5), and removal of the patterned photoresist layer 212 (shown in FIG. 6). Referring to FIG. 3, the photoresist layer 212 is deposited over the third resistor layer 210 using spin-on coating. The photoresist layer 212 may be a single layer or a multi-layer. To pattern the photoresist layer 212, the photoresist layer 212 is exposed to a radiation reflected from or transmitting through a photomask, baked in a post-exposure bake process, developed in a development process, and rinsed. The pattern of the photomask is thereby transferred to the photoresist layer 212, as shown in FIG. 4. The patterned photoresist layer 212 is applied as an etch mask to etch the first resistor layer 206, the second resistor layer 208, and the third resistor layer 210 until portions of the first IMD layer 204 are exposed, as shown in FIG. 5.

The etching at block 110 may be implemented using a combination of dry etch processes and wet etch processes. In some embodiments, the workpiece may be moved around different process chambers to undergo different etch processes targeting different layers. As a result, the resistor 300 and the dummy resistor 400 shown in FIGS. 5 and 6 include tapered sidewalls that tapers upward. That is, in each of the resistor 300 and the dummy resistor 400, an area of the third resistor layer 210 is smaller than an area of the second resistor layer 208 and the area of the second resistor layer 208 is smaller than an area of the first resistor layer 206. To form the resistor 300 and the dummy resistor 400 with tapered sidewalls, an example process illustrated in FIG. 14 may be used. The example etch process illustrated in FIG. 14 include a first sub-process that is selective to the third resistor layer 210, a second sub-process that is selective to the second resistor layer 208, and a third sub-process that is selective to the first resistor layer 206. That way, the patterned third resistor layer 210 would serve as an etch mask for the second resistor layer 208 and the then patterned second resistor layer 208 would serve as an etch mask for the first resistor layer. An example process to selectively etch a resistor layer that is formed of a chromium-containing material may be a dry etch process (such as a reactive-ion etch (RIE) process) that uses a chlorine-containing gas (e.g., $Cl_2$, $CHCl_3$, $CCl_4$, and/or $BCl_3$) and an oxygen source gas (e.g., $O_2$ or $H_2O$). An example process to selectively etch a resistor layer that is formed of TiN or TaN may be a wet etch process that uses a sulfuric acid hydrogen peroxide mixture (SPM), a mixture of ammonium hydroxide and hydrogen peroxide (SC1), or a mixture of hydrochloric acid and hydrogen peroxide (SC2) or a dry etch process that uses a chlorine-containing gas (e.g., $Cl_2$ and/or $BCl_3$), argon (Ar), other suitable gases and/or plasmas, and/or combinations thereof. An example process to selectively etch a resistor layer that is formed of TiW or TaW may be a dry etch process that uses argon (Ar), a fluorine-containing gas (e.g., $CF_4$, $SF_6$, $CH_2F_2$, $CHF_3$, $CH_3F$, $C_4H_8$, $C_4F_6$, and/or $C_2F_6$), a carbon-containing gas (e.g., CO, $CH_4$, and/or $C_3H_8$), a chlorine-containing gas (e.g., $Cl_2$, $CHCl_3$, $CCl_4$, and/or $BCl_3$), other suitable gases and/or plasmas, and/or combinations thereof.

Figure 7:
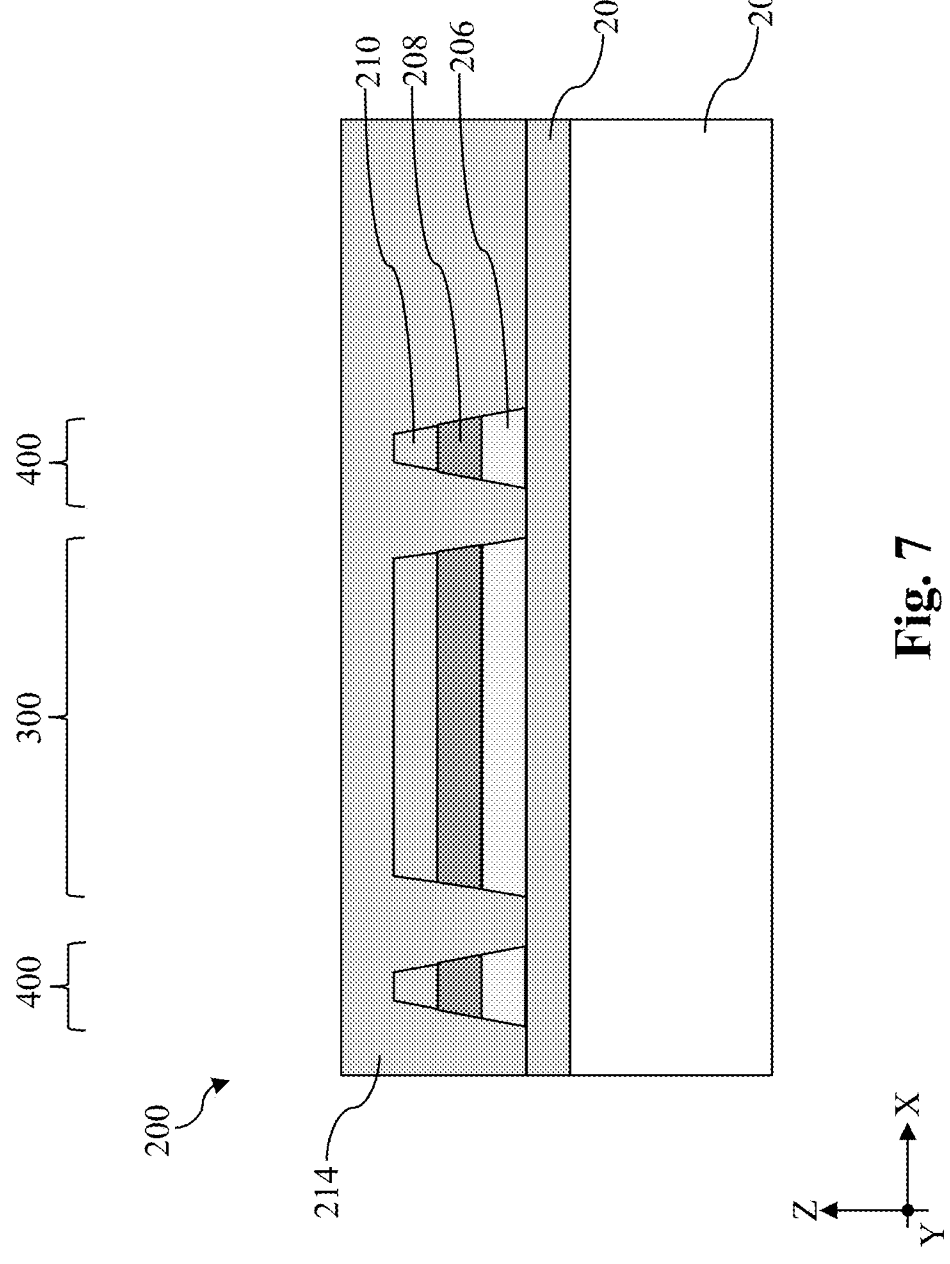

Referring to FIGS. 1 and 7, method 100 includes a block 112 where the second IMD layer 214 is deposited over the resistor 300 and the dummy resistor 400. In some embodiments, the second IMD layer 214 includes silicon oxide, undoped silica glass (USG), phosphor doped silicate glass (PSG), fluorine doped silicate glass (FSG), a boron doped silicate glass (BSG) layer, or a boron phosphorous-doped silicate glass (BPSG). At block 112, the second IMD layer 214 may be deposited over the resistor 300, the dummy resistor 400, and the first IMD layer 204 using spin-on coating, flowable chemical vapor deposition (FCVD), or CVD.

Figure 8:
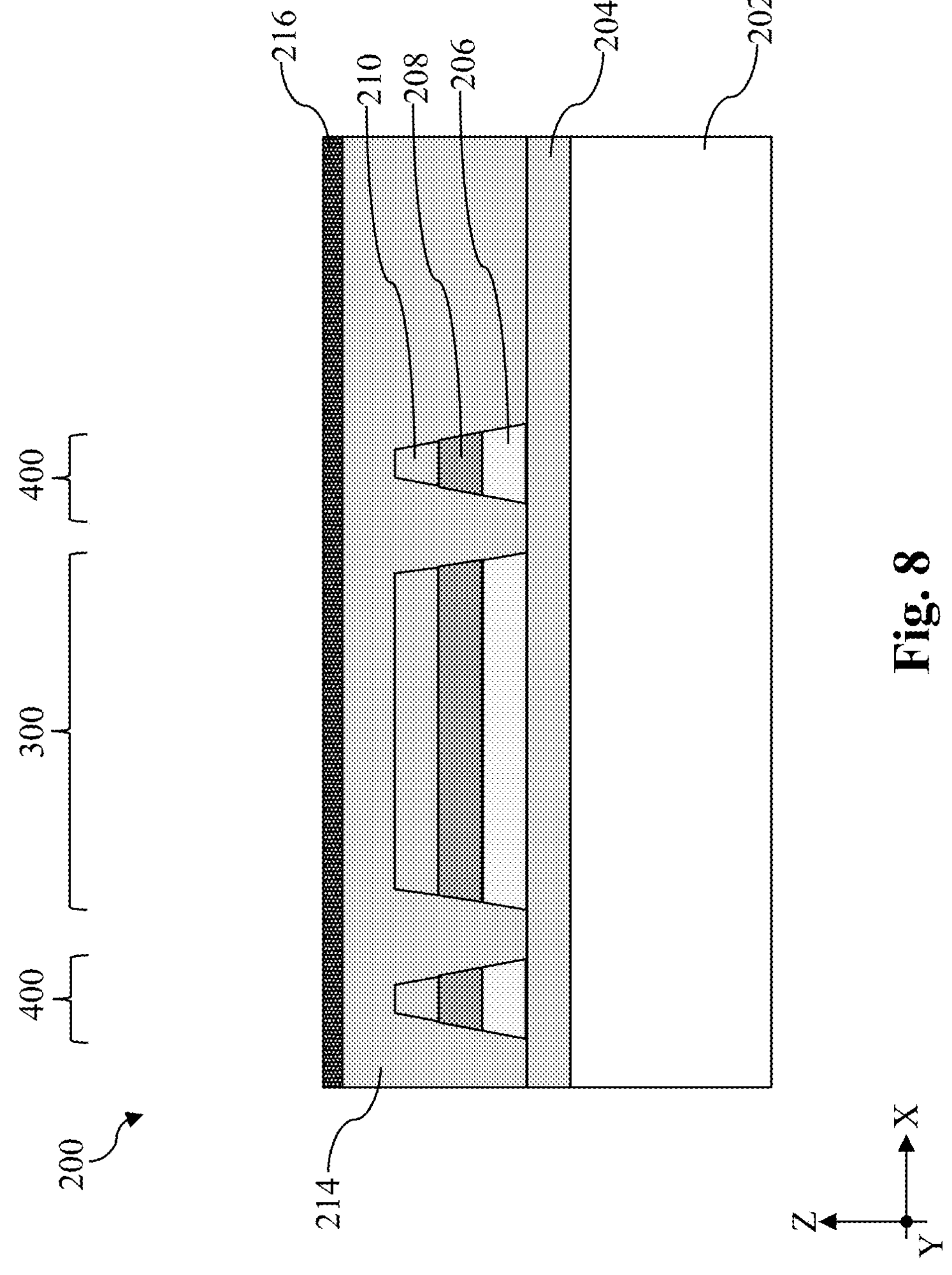

Referring to FIGS. 1 and 8, method 100 includes a block 114 where a liner 216 is deposited over the second IMD layer 214. In some embodiments, the liner 216 may include silicon nitride (SiN), silicon oxynitride (SiON), or silicon carbide (SiC). In some implementations, the liner 216 may have a thickness between about 50 Å and about 700 Å. In some implementations, the liner 216 may be deposited using ALD or CVD.

Figure 9:
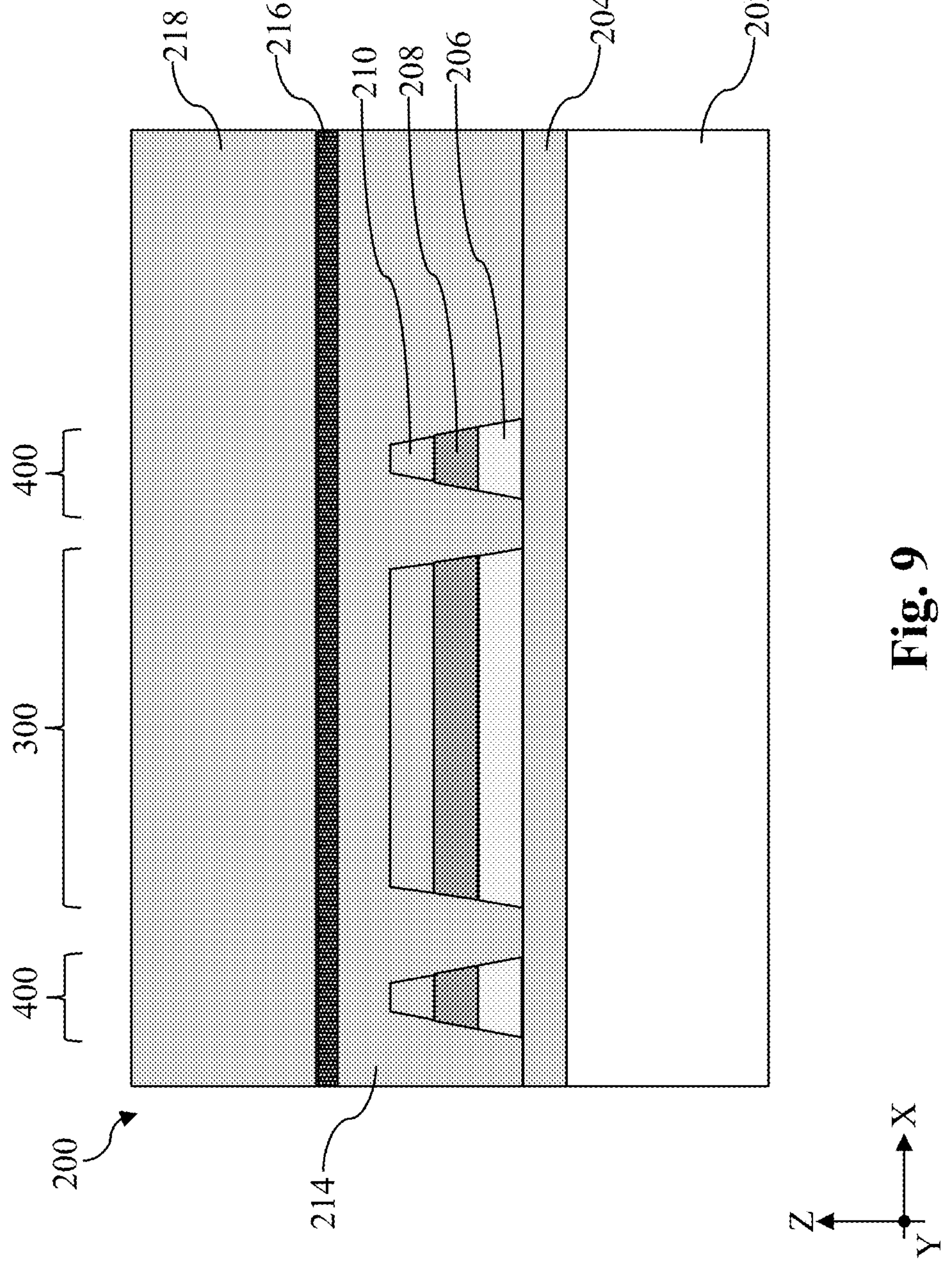

Referring to FIGS. 1 and 9, method 100 includes a block 116 where a third IMD layer 218 is deposited over the liner 216. In some embodiments, the third IMD layer 218 includes silicon oxide, undoped silica glass (USG), phosphor doped silicate glass (PSG), fluorine doped silicate glass (FSG), a boron doped silicate glass (BSG) layer, or a boron phosphorous-doped silicate glass (BPSG). At block 116, the third IMD layer 218 may be deposited over the liner 216 using spin-on coating, flowable chemical vapor deposition (FCVD), or CVD.

Figure 10:
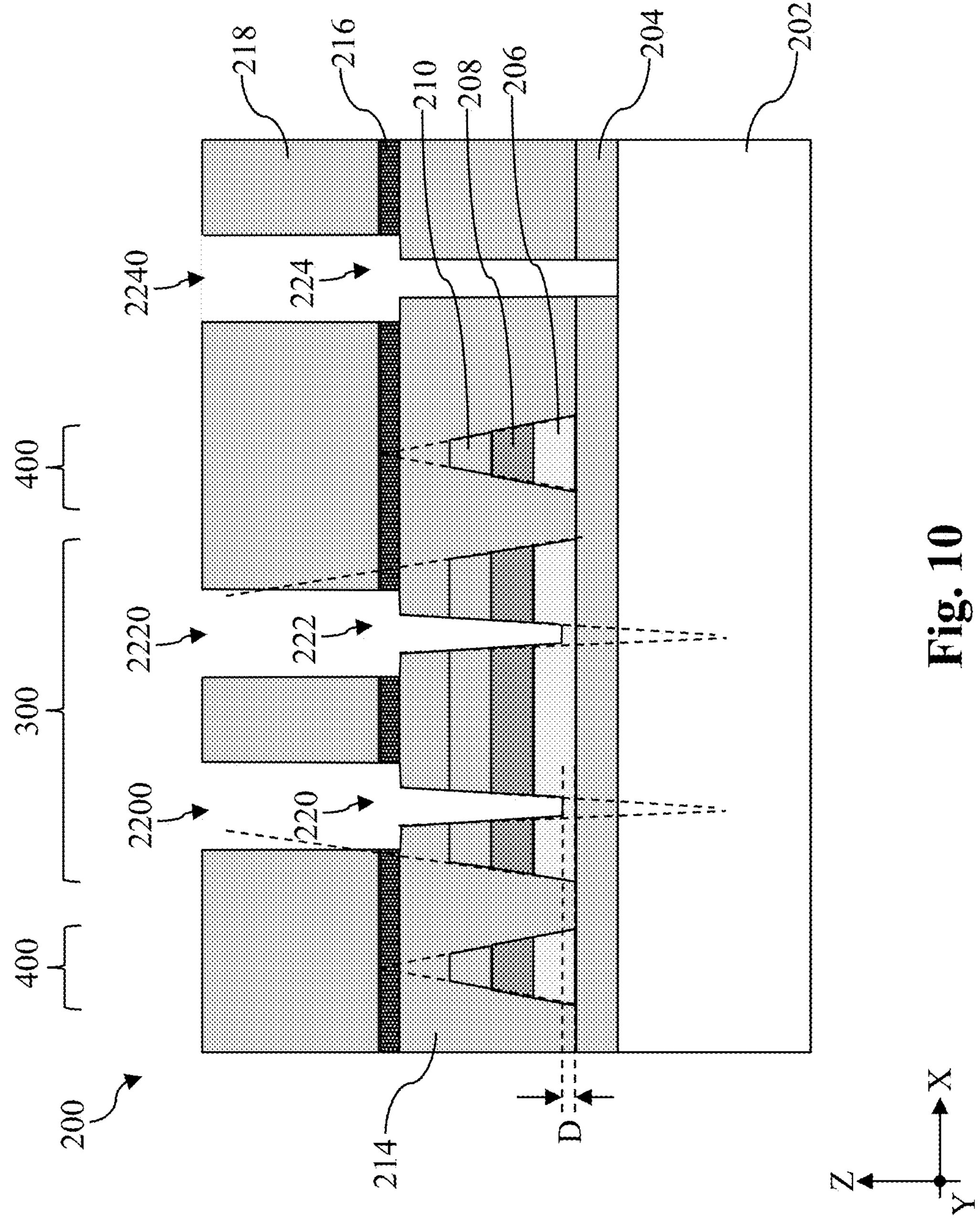

Referring to FIGS. 1 and 10, method 100 includes a block 118 where contact via openings 220, 222 and 224 are formed over the resistor 300. In addition to the contact via openings 220, 222 and 224, operations at block 118 also form a trench 2200 over the contact via opening 220, a trench 2220 over the contact via opening 222, and a trench 2240 over the contact via opening 224. The contact vias and trenches may be formed using photolithography and etch processes, such as in a dual damascene process. In an example process, a photoresist layer is deposited on the third IMD layer 218, such as by using spin-on coating. The deposited photoresist layer is then patterned to have a pattern corresponding to the trenches 2200, 2220 and 2240 by exposing the photoresist layer to a radiation source using an appropriate photomask. The exposed photoresist layer is then baked and developed to form a patterned photoresist layer. The pattern of the patterned photoresist layer may then be transferred to the third IMD layer 218 and the liner 216, such as by using a dry etch process. A suitable dry etch for etching the liner 216 and the third IMD layer 218 at block 118 may include a reactive ion etch (RIE), neutral beam etch (NBE), inductive coupled plasma (ICP) etch, the like, which uses oxygen ($O_2$), hydrogen ($H_2$), a fluorine-containing gas (e.g., $CF_4$, $NF_3$, $SF_6$, $CH_2F_2$, $CHF_3$, and/or $C_2F_6$), a hydrocarbon (e.g. methane), other suitable gases and/or plasmas, and/or combinations thereof. The liner 216 may be used as an etch stop for the dry etch process. Subsequently, the photoresist layer is removed in an ashing or wet stripping process. At this point, the trenches 2200, 2220 and 2240 are formed in the liner 216 and the third IMD layer 218. Then, another photoresist layer may be formed over the third IMD layer 218 and trenches 2200, 2220 and 2240, such as by using spin-on coating. The newly formed photoresist layer is then patterned to have a pattern corresponding to the contact via openings 220, 222 and 224 by exposing the photoresist layer to a radiation source using an appropriate photomask. The exposed photoresist layer is then baked and developed to form a patterned photoresist layer. The pattern of the patterned photoresist layer may then be transferred to the second IMD layer 214 and then the third resistor layer 210, the second resistor layer 208 and the first resistor layer 206, such as by using a dry etch process, a wet process, or a combination thereof.

In some embodiments, the etch process shown in FIG. 14 and described above with respect to block 110 may be performed to form contact via openings that taper downward (shown by the dotted lines extending from the contact via openings 220 and 222), rather than tapering upward like sidewalls of the resistor 300 and the dummy resistor 400. The detailed description of the etch process in FIG. 14 has been described above and will be omitted for brevity. The downward tapering is not trivial. When contact vias are formed in the subsequent step, the contact via makes contact with the third resistor layer 210 and the second resistor layer 208 by way of sidewalls of the contact via. The contact via makes contact with the first resistor layer 206 by way of not only sidewalls of the contact via but also a bottom surface of the contact via. This arrangement ensures that contact via have satisfactory contact with the first resistor layer 206, the second resistor layer 208 and the third resistor layer 210. In some other embodiments, a single dry etch process or a single wet etch process may be used to form the contact via openings.

In some embodiments represented in FIG. 10, the contact via openings 220 and 222 do not extend completely through the first resistor layer 206. Instead, the contact via openings 220 and 222 terminate in the first resistor layer 206. This arrangement is not trivial. Terminating the contact via openings in the first resistor layer 206 reduces the aspect ratio of the contact via openings as compared to contact via openings that extend completely through the first resistor layer 206. Reduction of the aspect ratio reduces undesirable damages during the opening formation process and facilitate satisfactory deposition of a metal fill material in the contact via openings. In some instances, bottom surfaces of the contact via openings 220 and 222 are a distance D away from a bottom surface of the first IMD layer 204. In some instances, the distance D may be between about 50 Å and about 100 Å.

Block 118 does not form any contact via openings in the dummy resistor 400.

Figure 11:
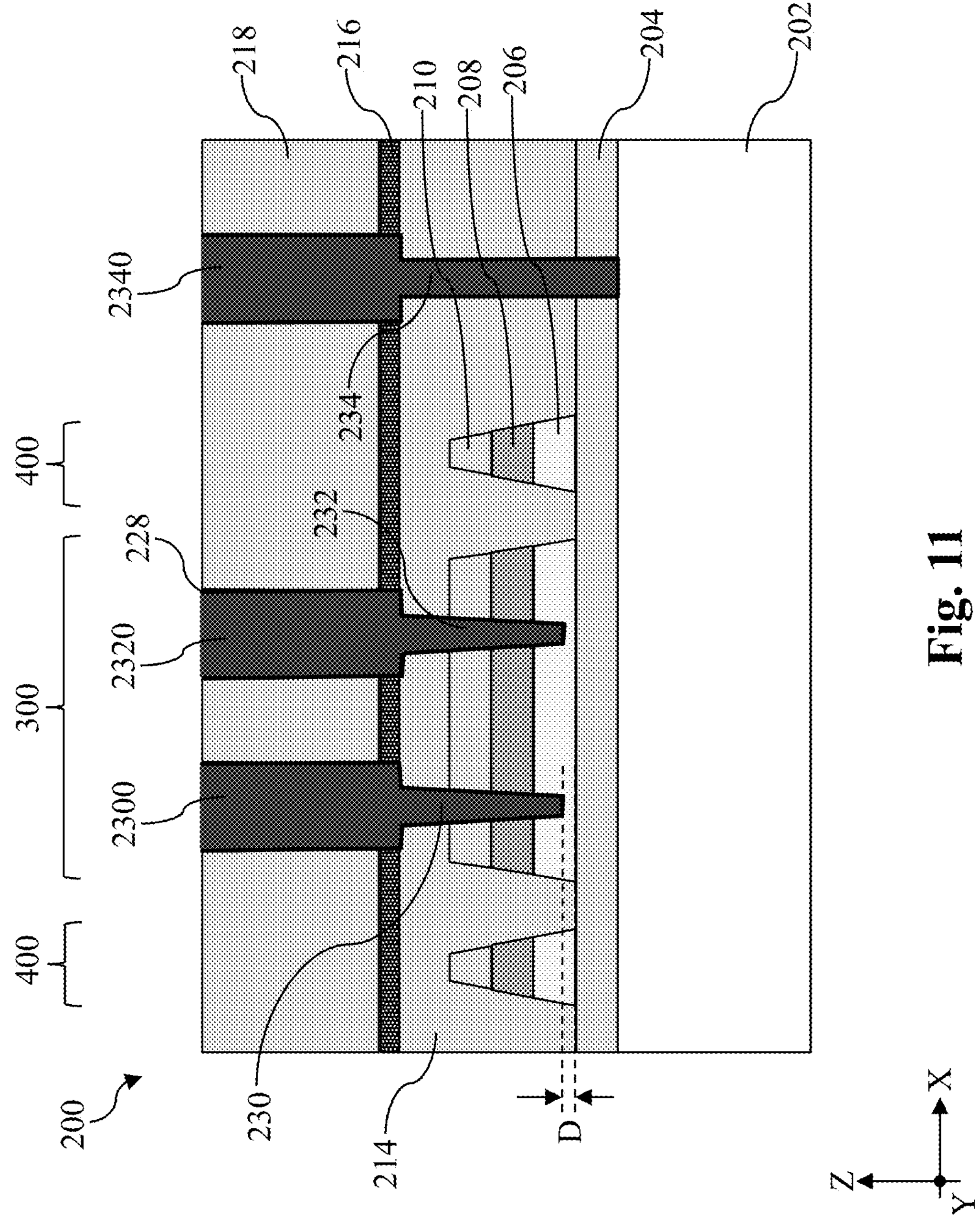

Referring to FIGS. 1 and 11, method 100 includes a block 120 where contact vias are formed in the contact via openings. In some embodiments, operations at block 120 form not only the contact vias 230, 232 and 234 but also metal lines 2300, 2320 and 2340. As shown in FIG. 11, the metal line 2300 is disposed over and in contact with the contact via 230, the metal line 2320 is disposed over and in contact with the contact via 232, and the metal line 2340 is disposed over and in contact with the contact via 234. At block 120, a barrier layer 228 is conformally deposited over the trenches and contact via openings. In some embodiments, the barrier layer 228 may include manganese nitride (MnN), titanium nitride (TiN) or tantalum nitride (TaN) and may be deposited using ALD, CVD, or a suitable method. Then the metal fill layer is deposited over the barrier layer 228 to fill the contact via openings and trenches. The metal fill layer may include copper (Cu), aluminum-copper (AlCu), cobalt (Co), ruthenium (Ru), or tungsten (W) and may be deposited using physical vapor deposition (PVD), electroless plating, electroplating, or a suitable method. In some embodiment, the metal fill layer include copper (Cu). In some embodiments, when the metal fill layer is deposited using electroplating, a seed layer may include copper (Cu) or titanium (Ti) or both and may be deposited over the barrier layer 228 using PVD. As shown in FIG. 11, the barrier layer 228 is in direct contact with the first resistor layer 206, the second resistor layer 208, the third resistor layer 210, the second IMD layer 214, the liner 216, and the third IMD layer 218. After deposition of the barrier layer 228 and the metal fill layer, a planarization process, such as a chemical mechanical polishing (CMP) process, is performed to remove excess materials. At this point, the contact vias 230, 232 and 234 and metal lines 2300, 2320 and 2340 are formed, as shown in FIG. 11.

Figure 12:
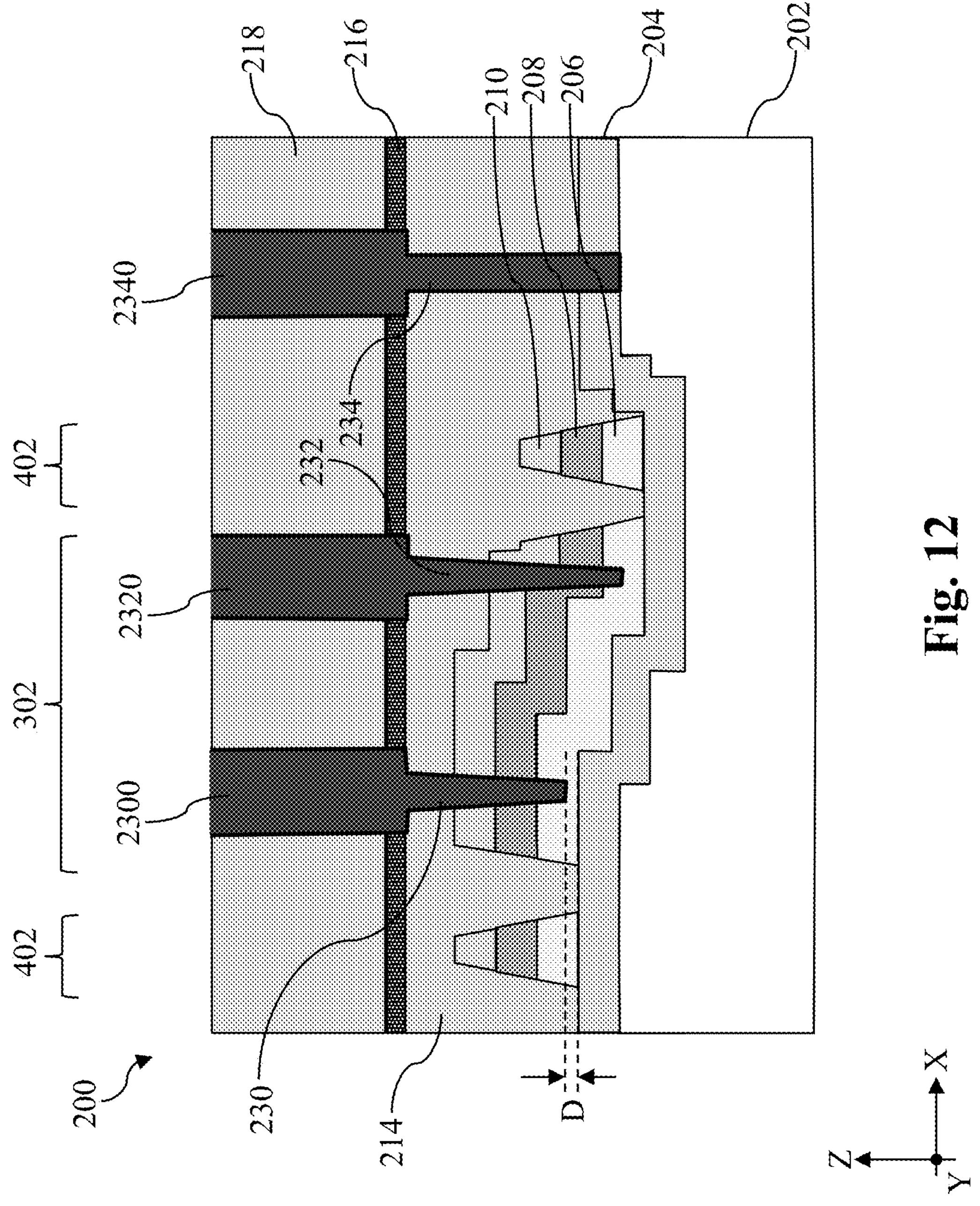

Using methods of the present disclosure, the resistor 300 and the dummy resistor 400 may be formed when the first IMD layer 204 is not flat. FIG. 12 illustrates a situation where the first IMD layer 204, or even the underlying substrate 202, includes step changes. By using conformal deposition, the first resistor layer 206, the second resistor layer 208 and the third resistor layer 210 may be deposited over the uneven first IMD layer 204 with a step coverage between about 30% and about 100%. After the patterning, a step-shape resistor 302 and a step-shape dummy resistor 402 may be formed. As shown in FIG. 12, along the X direction, the step-shape resistor 302 includes the first resistor layer 206, the second resistor layer 208 and the third resistor layer 210 conformally deposited over the step-shape surface of the first IMD layer 204. The step-shape dummy resistor 402 may include portions disposed on surfaces of different height. FIG. 13 illustrates a situation where a surface of the first IMD layer 204 is sloped. By using conformal deposition, the first resistor layer 206, the second resistor layer 208 and the third resistor layer 210 may be deposited over the sloped surface of the first IMD layer 204. After the patterning, a sloped resistor 304 and a sloped dummy resistor 404 may be formed. As shown in FIG. 13, along the X direction, the sloped resistor 304 and the sloped dummy resistor 404 each include a sloped first resistor layer 206, a sloped second resistor layer 208 and a sloped third resistor layer 210 deposited one over another on the sloped surface.

Block 120 does not form any contact vias to couple to the dummy resistor 400. The dummy resistor 400 is insulated from the resistor 300 and the contact vias. Because the first resistor layer 206, the second resistor layer 208 and the third resistor layer 210 in the dummy resistor 400 is not electrically connected to anything to serve as a resistor, they may be referred to dummy resistor layers.

Reference is now made to FIG. 11. The resistor 300 includes the first resistor layer 206, the second resistor layer 208, and the third resistor layer 210, each of which functions as a thin film resistor. Because the resistor 300 includes three resistor layers laminated together, the resistor 300 may also be referred to a laminate thin film resistor. The resistor 300 is accessed by way of at least the contact vias 230 and 232, which are in electrical contact with the first resistor layer 206, the second resistor layer 208 and the third resistor layer 210. The first resistor layer 206, the second resistor layer 208, and the third resistor layer 210 are connected in parallel to provide an effective resistance of the resistor 300. As described above, a sheet resistance of the third resistor layer 210 is greater than a sheet resistance of the second resistor layer 208, and the sheet resistance of the second resistor layer 208 is greater than a sheet resistance of the first resistor layer 206. To achieve this sheet resistance hierarchy, the TCRs of the first resistor layer 206, the second resistor layer 208 and the third resistor layer 210 may be different from one another. In some embodiments, materials and formation processes for the first resistor layer 206, the second resistor layer 208 and the third resistor layer 210 are selected to give the resistor 300 a TCR that is substantially zero.

Figure 15:
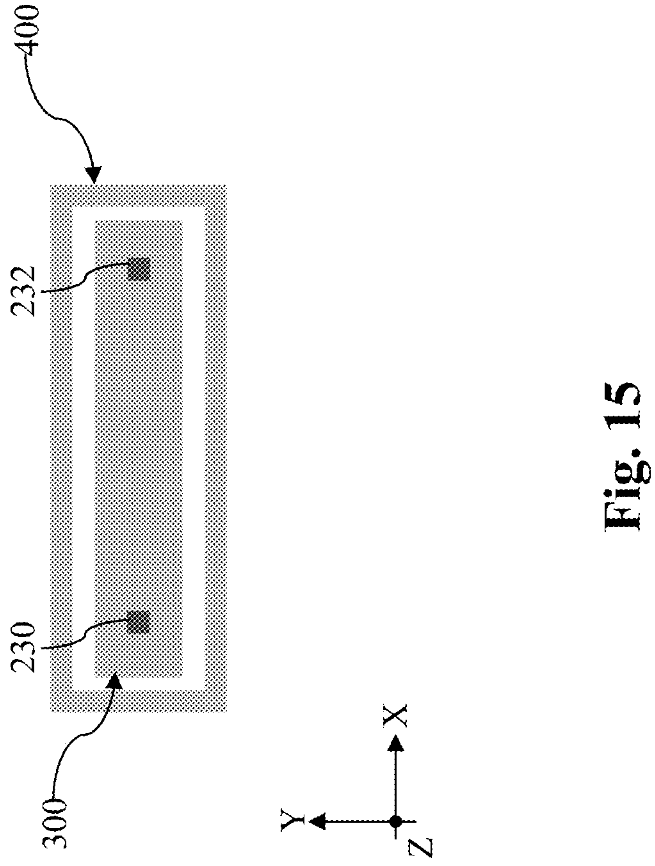
FIGS. 15-18 illustrate schematic top views of resistors according to various embodiments of the present disclosure.

FIGS. 11-13 illustrates a fragmentary cross-sectional view of the resistor 300. From a top view, the resistor 300 may include different shapes and configurations to fit different design needs. FIG. 15 illustrates a resistor 300 continuously surrounded by a dummy resistor 400. The resistor 300 in FIG. 15 is rectangular and extends lengthwise along the X direction. The dummy resistor 400 is a rectangular loop that tracks the shape of the resistor 300. A cross-sectional view of the resistor 300 and the dummy resistor 400 along the X direction may resemble the resistor 300 and the dummy resistor 400 shown in FIG. 11. Each of the resistor 300 and the dummy resistor 400 is a laminate including the first resistor layer 206, the second resistor layer 208 and the third resistor layer 210. The contact vias 230 and 232 extend through the third resistor layer 210, the second resistor layer 208, and partially through the first resistor layer 206. The dummy resistor 400 helps provide a uniform pattern loading to improve yield.

Figure 16:
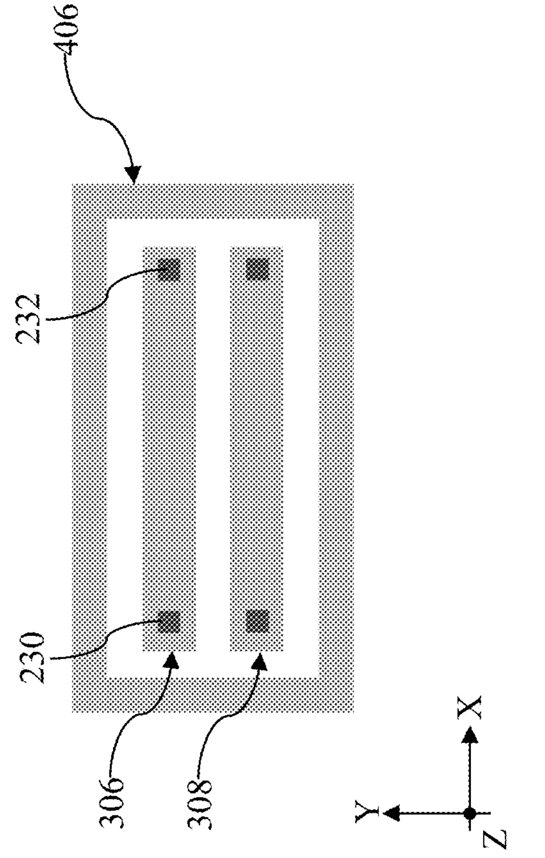

FIG. 16 illustrates a first rectangular resistor 306 and a second rectangular resistor 308 continuously surrounded by a rectangular dummy resistor 406. Instead of having each of the first rectangular resistor 306 and the second rectangular resistor 308 individually surrounded by a dummy resistor, both of the first rectangular resistor 306 and the second rectangular resistor 308 are surrounded as a whole by the rectangular dummy resistor 406. The first rectangular resistor 306, the second rectangular resistor 308, and the rectangular dummy resistor 406 are patterned by the same stack of the first resistor layer 206, the second resistor layer 208 and the third resistor layer 210. Each of the first rectangular resistor 306 and the second rectangular resistor 308 is accessed by two contact vias 230 and 232. While two rectangular resistors are shown in FIG. 16, the rectangular dummy resistor 406 may be configured to continuously surround three or more rectangular resistors.

Figure 17:
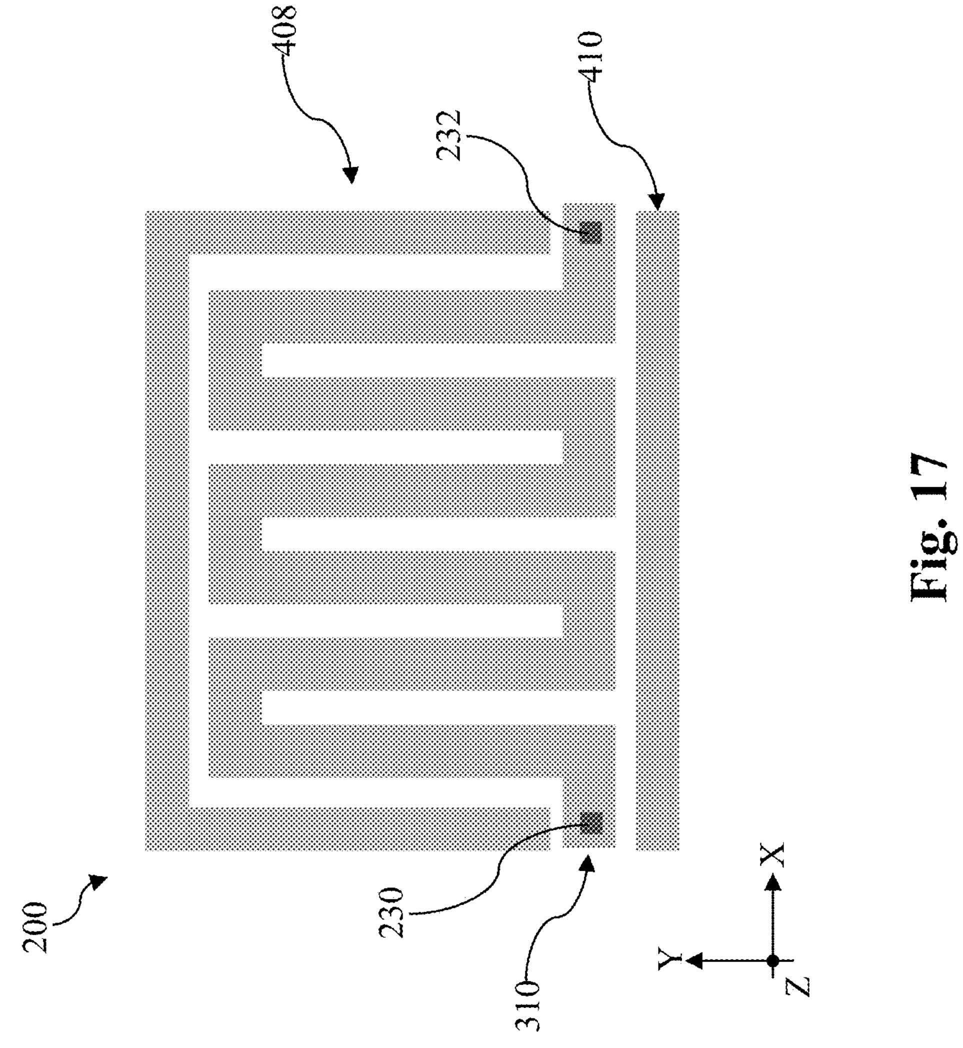

FIG. 17 illustrates a serpentine resistor 310 surrounded by a horseshoe dummy resistor 408 and a flat dummy resistor 410. Instead of being continuously surrounded by a single dummy resistor, the serpentine resistor 310 is substantially surrounded by two discontinuous resistors—the horseshoe dummy resistor 408 and the flat dummy resistor 410. Two end portions of the serpentine resistor 310 extend between the gaps between the horseshoe dummy resistor 408 and the flat dummy resistor 410. The serpentine resistor 310 is accessed by two contact vias 230 and 232 making contact with the serpentine resistor 310 adjacent the two end portions. This arrangement ensures the current to pass through the entire length of the serpentine resistor 310. The serpentine resistor 310 in FIG. 17 includes three U-shape bends. In some embodiments where a greater resistance is desired, the serpentine resistor 310 may include more than three U-shaped bends. In some other embodiments where a smaller resistance is desired, the serpentine resistor 310 may include less than three U-shaped bends.

Figure 18:
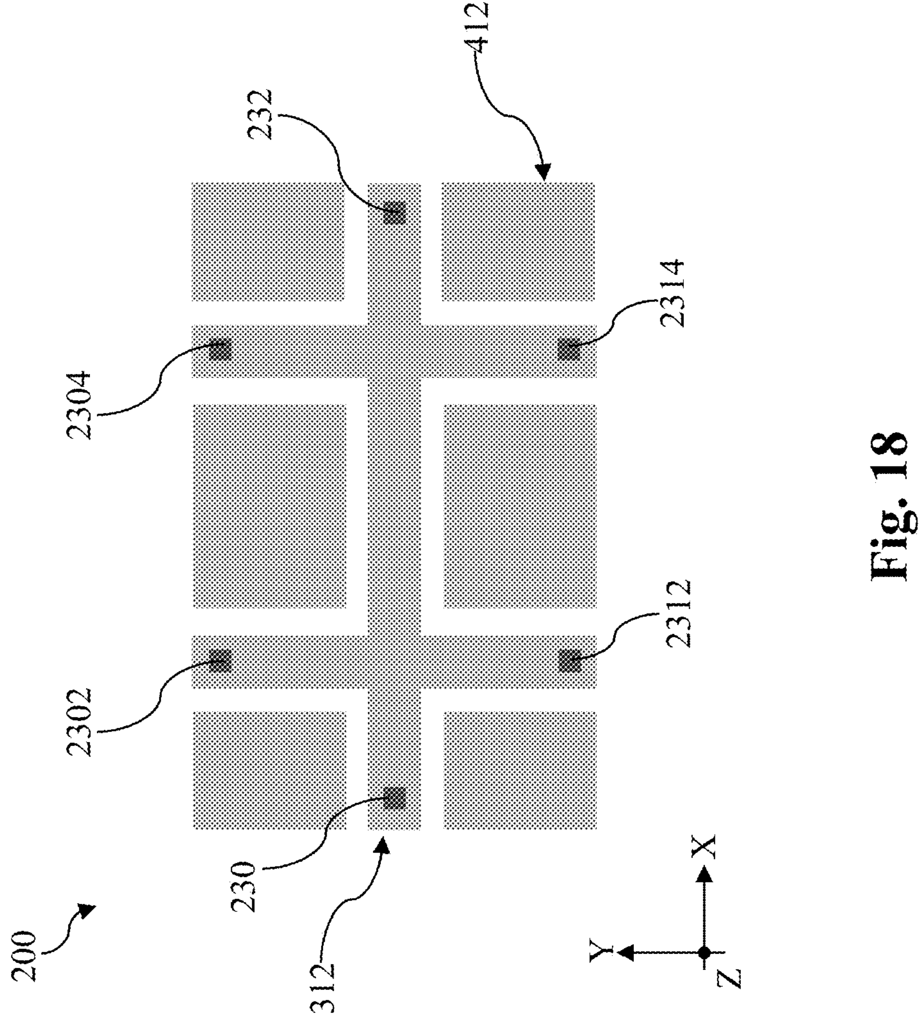

FIG. 18 illustrates a two-barred-cross resistor 312 that is surrounded by six (6) block resistors 412. The two-barred-cross resistor 312 includes a long bar extending along the X direction and two arms extending along the Y direction. The two-barred-cross resistor 312 defines six rectangular-shaped spaces. The six block resistors 412 are disposed within the six rectangular-shaped spaces. The six block resistors 412 reduce pattern loading when patterning the two-barred-cross resistor 312 and performing a planarization process. Each of the long bar and two arms of the two-barred-cross resistor 312 may function as a resistor. The resistor in the long bar is accessed by contact vias 230 and 232. The resistor in the left arm is accessed by contact vias 2302 and 2312. The resistor in the right arm is accessed by contact vias 2304 and 2314.

Thus, in one aspect, the present disclosure provides a device structure. The device structure includes a substrate, a first intermetal dielectric (IMD) layer over the substrate, a resistor that includes a first resistor layer over the first IMD layer, a second resistor layer over the first resistor layer, and a third resistor layer over the second resistor layer, a second IMD layer over the first IMD layer and the resistor, and a first contact via and a second contact via extending through the second IMD layer and the third resistor layer and terminating in the first resistor layer.

In some embodiments, sidewalls of the resistor taper upward such that an area of the first resistor layer is greater than an area of the second resistor layer and that the area of the second resistor layer is greater than an area of the third resistor layer. In some embodiments, a sheet resistance of the third resistor layer is greater than a sheet resistance of the second resistor layer and the sheet resistance of the second resistor layer is greater than a sheet resistance of the first resistor layer. In some implementations, at least one of the first resistor layer, the second resistor layer and the third resistor layer includes a chromium-containing material. At least one of the other two of the first resistor layer, the second resistor layer and the third resistor layer includes titanium nitride (TiN), titanium tungsten (TiW), tantalum nitride (TaN), or tantalum tungsten (TaW). In some embodiments, the chromium-containing material includes silicon chromium (SiCr), nickel chromium (NiCr), nickel chromium silicon (NiCrSi), chromium silicate (Cr—SiO), or silicon chromium nitride (SiCrN). In some embodiments, the at least one of the first resistor layer, the second resistor layer and the third resistor layer that includes the chromium-containing material has a thickness between 100 Å and about 200 Å. In some embodiments, the at least one of the other two of the first resistor layer, the second resistor layer and the third resistor layer that includes titanium nitride (TiN), titanium tungsten (TiW), tantalum nitride (TaN), or tantalum tungsten (TaW) has a thickness between 50 Å and about 1000 Å. In some instances, an overall effective temperature coefficient of resistance of the resistor is substantially zero. In some embodiments, the device structure further includes at least one dummy resistor disposed over the first IMD layer and in the second IMD layer. The at least one dummy resistor includes a first dummy resistor layer over the first IMD layer, a second dummy resistor layer over the first dummy resistor layer, and a third dummy resistor layer over the second dummy resistor layer. The at least one dummy resistor is insulated from the first contact via and the second contact via.

Yet another aspect of the present disclosure involves a structure. The structure includes a substrate, a first intermetal dielectric (IMD) layer over the substrate, a resistor disposed over the first IMD layer and having at least two resistor layers, a dummy resistor disposed over the first IMD layer and having the at least two resistor layers, a second IMD layer over the first IMD layer, the resistor and the dummy resistor, and a first contact via and a second contact via in direct contact the at least two resistor layers in the resistor. From a top view, the dummy resistor surrounds the resistor.

In some embodiments, from a side view, sidewalls of the resistor taper upward. In some embodiments, from the side view, sidewalls of the first contact via and the second contact via taper downward. In some implementations, from the side view, sidewalls of the dummy resistor taper upward. In some embodiments, the at least two resistor layers include a first resistor layer, a second resistor layer over the first resistor layer, and a third resistor layer over the second resistor layer. The first resistor layer includes a first temperature coefficient of resistance (TCR), the second resistor layer includes a second TCR, and the third resistor layer includes a third TCR. The first TCR, the second TCR, and the third TCR are different from one another. In some embodiments, an overall effective TCR of the resistor is substantially zero.

In still another aspect of the present disclosure, the present disclosure provides a method. The method includes depositing a first dielectric layer over a substrate, depositing a first resistor layer over the first dielectric layer, depositing a second resistor layer over the first resistor layer, depositing a third resistor layer over the second resistor layer, after the depositing of the third resistor layer, patterning the first resistor layer, the second resistor layer and the third resistor layer to form a resistor on the first dielectric layer, and depositing a second dielectric layer over the resistor and the first dielectric layer.

In some embodiments, the patterning further forms a dummy resistor on the first dielectric layer. The depositing of the second dielectric layer further includes depositing the second dielectric layer over the dummy resistor. In some embodiments, at least one of the first resistor layer, the second resistor layer and the third resistor layer includes a chromium-containing material and at least one of the other two of the first resistor layer, the second resistor layer and the third resistor layer includes titanium nitride (TiN), titanium tungsten (TiW), tantalum nitride (TaN), or tantalum tungsten (TaW). In some embodiments, the chromium-containing material includes silicon chromium (SiCr), nickel chromium (NiCr), nickel chromium silicon (NiCrSi), chromium silicate (Cr—SiO), or silicon chromium nitride (SiCrN). In some embodiments, the method further includes depositing a liner over the second dielectric layer, depositing a third dielectric layer over the liner, forming a first contact opening and a second contact opening through the third dielectric layer, the liner, the second dielectric layer, the third resistor layer, the second resistor layer, and terminating in the first resistor layer, and forming a first contact via in the first contact opening and a second contact via in the second contact opening.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit line conductor and word line conductor, one can achieve different resistances for the conductors. However, other techniques to vary the resistances of the metal conductors may also be utilized as well.

What is claimed is:

1. A device structure, comprising:
- a substrate;
- a first intermetal dielectric (IMD) layer over the substrate;
- a resistor comprising:
  - a first resistor layer over and interfacing a top surface of the first IMD layer,
  - a second resistor layer over the first resistor layer, and
  - a third resistor layer over the second resistor layer;
- a second IMD layer over the first IMD layer and the resistor; and
- a first contact via and a second contact via extending through the second IMD layer and the third resistor layer and terminating in the first resistor layer.

2. The device structure of claim 1, wherein sidewalls of the resistor taper upward such that an area of the first resistor layer is greater than an area of the second resistor layer and that the area of the second resistor layer is greater than an area of the third resistor layer.

3. The device structure of claim 1, wherein a sheet resistance of the third resistor layer is greater than a sheet resistance of the second resistor layer and the sheet resistance of the second resistor layer is greater than a sheet resistance of the first resistor layer.

4. The device structure of claim 1,
- wherein at least one of the first resistor layer, the second resistor layer and the third resistor layer comprises a chromium-containing material,
- wherein at least one of the other two of the first resistor layer, the second resistor layer and the third resistor layer comprises titanium nitride (TiN), titanium tungsten (TiW), tantalum nitride (TaN), or tantalum tungsten (TaW).

5. The device structure of claim 4, wherein the chromium-containing material comprises silicon chromium (SiCr), nickel chromium (NiCr), nickel chromium silicon (NiCrSi), chromium silicate (Cr—SiO), or silicon chromium nitride (SiCrN).

6. The device structure of claim 4, wherein the at least one of the first resistor layer, the second resistor layer and the third resistor layer that includes the chromium-containing material comprises a thickness between 100 Å and about 200 Å.

7. The device structure of claim 4, wherein the at least one of the other two of the first resistor layer, the second resistor layer and the third resistor layer that includes titanium nitride (TiN), titanium tungsten (TiW), tantalum nitride (TaN), or tantalum tungsten (TaW) comprises a thickness between 50 Å and about 1000 Å.

8. The device structure of claim 1, wherein an overall effective temperature coefficient of resistance of the resistor is substantially zero.

9. The device structure of claim 1, further comprising:
- at least one dummy resistor disposed over the first IMD layer and in the second IMD layer, wherein the at least one dummy resistor comprises:

a first dummy resistor layer over the first IMD layer, a second dummy resistor layer over the first dummy resistor layer, and a third dummy resistor layer over the second dummy resistor layer, wherein the at least one dummy resistor is insulated from the first contact via and the second contact via.

10. A structure, comprising:

a substrate;

a first intermetal dielectric (IMD) layer over the substrate;

a resistor disposed over the first IMD layer and comprising at least two resistor layers;

a dummy resistor disposed over the first IMD layer and comprising the at least two resistor layers;

a second IMD over the first IMD, the resistor and the dummy resistor; and a first contact via and a second contact via in direct contact the at least two resistor layers in the resistor, wherein, from a top view, the dummy resistor surrounds the resistor.

11. The structure of claim 10, wherein, from a side view, sidewalls of the resistor taper upward.

12. The structure of claim 11, wherein, from the side view, sidewalls of the first contact via and the second contact via taper downward.

13. The structure of claim 11, wherein, from the side view, sidewalls of the dummy resistor taper upward.

14. The structure of claim 10, wherein the at least two resistor layers comprises a first resistor layer, a second resistor layer over the first resistor layer, and a third resistor layer over the second resistor layer, wherein the first resistor layer comprises a first temperature coefficient of resistance (TCR), wherein the second resistor layer comprises a second TCR, wherein the third resistor layer comprises a third TCR, wherein the first TCR, the second TCR, and the third TCR are different from one another.

15. The structure of claim 14, wherein an overall effective TCR of the resistor is substantially zero.

16. A method, comprising:

depositing a first dielectric layer over a substrate;

depositing a first resistor layer over the first dielectric layer such that the first resistor layer interfaces a top surface of the first dielectric layer;

depositing a second resistor layer over the first resistor layer such that the second resistor layer interfaces a top surface of the first resistor layer;

depositing a third resistor layer over the second resistor layer;

after the depositing of the third resistor layer, patterning the first resistor layer, the second resistor layer and the third resistor layer to form a resistor on the first dielectric layer; and depositing a second dielectric layer over the resistor and the first dielectric layer, wherein the first resistor layer, the second resistor layer, and the third resistor layer comprise a metal-containing conductive material.

17. The method of claim 16, wherein the patterning further forms a dummy resistor on the first dielectric layer, wherein the depositing of the second dielectric layer further comprises depositing the second dielectric layer over the dummy resistor.

18. The method of claim 16, wherein at least one of the first resistor layer, the second resistor layer and the third resistor layer comprises a chromium-containing material, wherein at least one of the other two of the first resistor layer, the second resistor layer and the third resistor layer comprises titanium nitride (TiN), titanium tungsten (TiW), tantalum nitride (TaN), or tantalum tungsten (TaW).

19. The method of claim 18, wherein the chromium-containing material comprises silicon chromium (SiCr), nickel chromium (NiCr), nickel chromium silicon (NiCrSi), chromium silicate (Cr—SiO), or silicon chromium nitride (SiCrN).

20. The method of claim 16, further comprising:

depositing a liner over the second dielectric layer;

depositing a third dielectric layer over the liner;

forming a first contact opening and a second contact opening through the third dielectric layer, the liner, the second dielectric layer, the third resistor layer, the second resistor layer, and terminating in the first resistor layer; and forming a first contact via in the first contact opening and a second contact via in the second contact opening.

* * * * *